United States Patent
Cho et al.

(10) Patent No.: US 9,355,939 B2
(45) Date of Patent: May 31, 2016

(54) INTEGRATED CIRCUIT PACKAGE STACKING SYSTEM WITH SHIELDING AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 779 days.

(21) Appl. No.: 12/716,269

(22) Filed: Mar. 2, 2010

(65) Prior Publication Data

US 2011/0215448 A1    Sep. 8, 2011

(51) Int. Cl.
| H01L 23/495 | (2006.01) |
| H01L 21/60 | (2006.01) |
| H01L 23/552 | (2006.01) |
| H01L 25/10 | (2006.01) |
| H01L 23/00 | (2006.01) |

(52) U.S. Cl.
CPC ............ *H01L 23/495* (2013.01); *H01L 23/552* (2013.01); *H01L 25/105* (2013.01); *H01L 24/73* (2013.01); *H01L 2224/16225* (2013.01); *H01L 2224/32145* (2013.01); *H01L 2224/32225* (2013.01); *H01L 2224/32245* (2013.01); *H01L 2224/48227* (2013.01); *H01L 2224/48247* (2013.01); *H01L 2224/73253* (2013.01); *H01L 2224/73265* (2013.01); *H01L 2225/1023* (2013.01); *H01L 2924/15311* (2013.01); *H01L 2924/181* (2013.01); *H01L 2924/3025* (2013.01); *H01L 2924/3511* (2013.01)

(58) Field of Classification Search
CPC ...... H01L 25/105; H01L 23/495; H01L 21/60
USPC .......................................................... 257/659
See application file for complete search history.

(56) References Cited

U.S. PATENT DOCUMENTS

| 5,175,613 | A | * | 12/1992 | Barker et al. | 257/713 |
| 5,198,693 | A | * | 3/1993 | Imken et al. | 257/720 |
| 6,084,308 | A | * | 7/2000 | Kelkar et al. | 257/777 |
| 6,235,603 | B1 | * | 5/2001 | Melnick et al. | 438/393 |
| 6,294,731 | B1 | | 9/2001 | Lu et al. | |
| 6,369,448 | B1 | * | 4/2002 | McCormick | 257/777 |
| 7,217,993 | B2 | | 5/2007 | Nishimura | |
| 7,261,596 | B2 | | 8/2007 | Akaike et al. | |
| 2003/0197260 | A1 | * | 10/2003 | Nishimura et al. | 257/686 |
| 2005/0006745 | A1 | * | 1/2005 | Nishimura | 257/686 |
| 2007/0284970 | A1 | * | 12/2007 | Fujita | 310/344 |
| 2008/0218974 | A1 | * | 9/2008 | Bartley et al. | 361/709 |
| 2009/0294941 | A1 | | 12/2009 | Oh et al. | |
| 2011/0101512 | A1 | * | 5/2011 | Choi et al. | 257/686 |

OTHER PUBLICATIONS

U.S. Appl. No. 12/325,193, filed Nov. 29, 2008, Ha et al.

\* cited by examiner

*Primary Examiner* — Sheng Zhu
(74) *Attorney, Agent, or Firm* — Ishimaru & Associates LLP (57) ABSTRACT

A method of manufacture of an integrated circuit package system includes: providing a base package substrate including: forming component contacts on a component side of the base package substrate, forming system contacts on a system side of the base package substrate, and forming a reference voltage circuit between the component contacts and the system contacts; mounting a first integrated circuit die on the component contacts; mounting a lead frame on the first integrated circuit die and coupled to the component contacts; and isolating a conductive shield from the lead frame, the conductive shield coupled to the reference voltage circuit.

20 Claims, 6 Drawing Sheets

INTEGRATED CIRCUIT PACKAGE STACKING SYSTEM WITH SHIELDING AND METHOD OF MANUFACTURE THEREOF

TECHNICAL FIELD

The present invention relates generally to integrated circuit package systems, and more particularly to a stackable system with an embedded shield.

BACKGROUND ART

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". The needs for portable personal electronics, such as cell phones, digital cameras, music players, personal digital assistants (PDA's), and location-based devices are particularly acute and have further driven the need for increased integrated circuit density.

This increased integrated circuit density has led to the development of multi-chip packages in which more than one integrated circuit can be packaged. For example, stackable package systems include stacked package carriers where each package carrier includes at least one integrated circuit.

However, in some cases, these dense systems may warp during manufacturing or in operation. This may result in poor yields, device failures, or reduced device lifetimes due to a variety of problems such as compromised mechanical properties or poor electrical connectivity. Contemporary electronics expose integrated circuits, integrated circuit packages, and electronic subassemblies to more demanding and sometimes harsh environmental conditions, such as cold, heat, and humidity requiring integrated circuit packages to provide robust mechanical structures. The range of operating conditions may also cause warpage resulting in failure, field returns, and increased cost.

Thus, a need still remains for a stackable integrated circuit package system that provides a low cost manufacturing, improved yield, and improved reliability. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing a base package substrate including: forming component contacts on a component side of the base package substrate, forming system contacts on a system side of the base package substrate, and forming a reference voltage circuit between the component contacts and the system contacts; mounting a first integrated circuit die on the component contacts; mounting a lead frame on the first integrated circuit die and coupled to the component contacts; and isolating a conductive shield from the lead frame, the conductive shield coupled to the reference voltage circuit.

The present invention provides an integrated circuit package system, including: a base package substrate including: component contacts on a component side of the base package substrate, system contacts on a system side of the base package substrate, and a reference voltage circuit connected between the component contacts and the system contacts; a first integrated circuit die mounted on the component contacts; and a conductive shield mounted directly on the first integrated circuit die includes the conductive shield coupled to the reference voltage circuit through the component contacts.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements without having intervening materials.

The term "processing" as used herein includes deposition of material or photoresist, patterning, exposure, development, etching, grinding, cleaning, and/or removal of the material or photoresist as required in forming a described structure.

Figure 1:
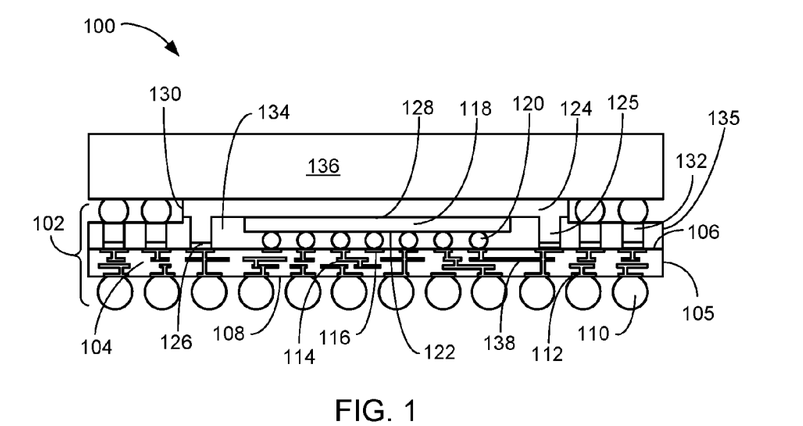
FIG. 1 is a cross-sectional view of an integrated circuit package system with package stacking in a first embodiment of the present invention.

Referring now to FIG. 1, therein is shown a cross-sectional view of an integrated circuit package system 100 with package stacking in a first embodiment of the present invention. The cross-sectional view of the integrated circuit package system 100 depicts a base package 102 having a base package substrate 104, such as a laminate substrate, with a component side 106 and a system side 108.

System interconnects 110, such as solder balls, solder bumps, solder columns or stud bumps, may be coupled to system contacts 112 on the system side 108. Internal circuitry 114, such as buried traces, vias, or a combination thereof, may couple the system contacts 112 to component contacts 116 on the component side 106.

A first integrated circuit die 118 may be coupled to the component contacts 116 by chip interconnects 120, such as solder bumps or solder balls. The chip interconnects 120 may be positioned between an active side 122 and the component contacts 116. A conductive shield 124, being a single monolithic structure including integrated vertical coupling leads 125, may be electrically connected to the component contacts 116 by a conductive adhesive 126, such as solder or conductive epoxy, and may be directly on an inactive side 128 of the first integrated circuit die 118. The conductive shield 124 and the inactive side 128 are in direct contact without having intervening materials. The conductive shield 124 is a single monolithic structure including the integrated vertical coupling leads 125 may be formed of a metal, such as copper (CU), nickel (NI), tin (SN), or an alloy thereof.

The conductive shield 124, having a finished surface 130 showing evidence of sawing, grinding or etching, may be directly coupled to the first integrated circuit die 118 and the system interconnects 110 by the internal circuitry 114 for applying a reference voltage (not shown) to the conductive shield 124 and the first integrated circuit die 118. It has been discovered that this direct coupling may provide an electromagnetic interference (EMI) shield while also providing a thermal path to reduce the operating temperature of the first integrated circuit die 118.

Pillar interconnects 132 may be grouped around the conductive shield 124 with a closer spacing than is possible for the system interconnects 110. The pillar interconnects may be electrically connected to the component contacts 116 by the conductive adhesive 126. The pillar interconnects 132 may have a height that is shorter than the inactive side 128 of the first integrated circuit die 118.

A base package body 134 may be formed of a molding compound injected around the pillar interconnects 132 and between the conductive shield 124 and the component side 106 to embed the integrated vertical coupling leads 125 and completely cover the component side 106. The base package body 134 can have vertical sides 135 coplanar with vertical edges 105 on the perimeter of the base package substrate 104. A stacked integrated circuit package 136, having the chip interconnects 120, may be positioned directly on the conductive shield 124 and coupled to the pillar interconnects 132 exposed from the base package body 134. The surface of the pillar interconnects 132 that are used for coupling the stacked integrated circuit package 136 may also have the finished surface 130 and show signs of having been sawed, ground, or etched.

The number and position of the chip interconnects 120 that couple the stacked integrated circuit package 136 to the pillar interconnects 132 exposed from the base package body 134 is an example only and the actual number and position may differ. A reference voltage circuit 138 may form the direct connection of between the first integrated circuit die 118, the conductive shield 124, and the system interconnects 110 that may be coupled to the reference voltage of the next level system (not shown).

The reference voltage circuit 138 may couple two of the adjacent units of the component contacts 116 to the closest unit of the system contacts 112. The reference voltage circuit 138 provides a short coupling path between the component contact 116 coupled to the first integrated circuit die 118, the component contact 116 coupled to the conductive shield 124, and the closest unit of the system contacts 112 for coupling a reference voltage from the next level system (not shown).

While the conductive shield 124 may have additional connections to the system interconnects 110 for applying the reference voltage, only one of the reference voltage circuits 138 may couple to the first integrated circuit die 118. It has been discovered that by providing only one of the reference voltage circuits 138 to the first integrated circuit die 118 less reference voltage noise may be coupled into the circuitry.

Figure 2:
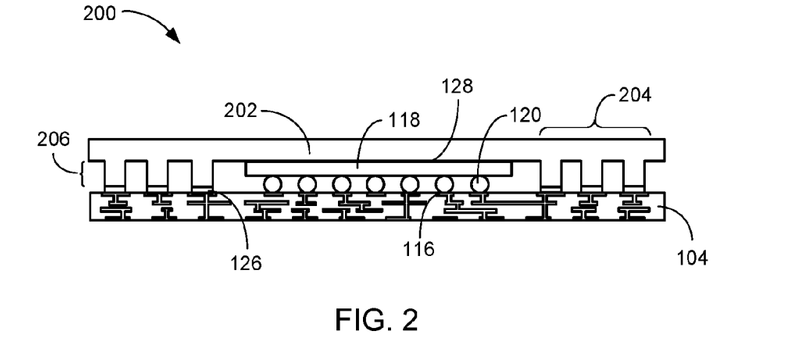
FIG. 2 is a cross-sectional view of an integrated circuit assembly, in a lead frame attach phase of manufacturing.

Referring now to FIG. 2, therein is shown a cross-sectional view of an integrated circuit assembly 200, in a lead frame attach phase of manufacturing. The cross-sectional view of the integrated circuit assembly 200 depicts the base package substrate 104 having the first integrated circuit die 118 electrically connected to the component contacts 116 by the chip interconnects 120.

A lead frame 202 may be positioned directly on the inactive side 128 of the first integrated circuit die 118. The lead frame 202 may include an array 204 of coupling leads 206 arranged around the first integrated circuit die 118.

It has been discovered that the position and number of the coupling leads 206 may be substantially similar to the spacing of the chip interconnects 120 that couple the first integrated circuit die 118 to the base package substrate 104. The lead frame 202 may be formed of a metal, such as copper (CU), nickel (NI), tin (SN), or an alloy thereof. The lead frame 202 may be manufactured by plating, sawing, etching, or molding, in order to provide a high degree of precision as to the placement and spacing of the coupling leads 206 in the array 204.

The coupling leads 206 are of insufficient height to reach the base package substrate 104 when the lead frame 202 is positioned directly on the inactive side 128 of the first integrated circuit die 118. The conductive adhesive 126 may form the electrical and physical connection between the coupling leads 206 and the component contacts 116.

Figure 3:
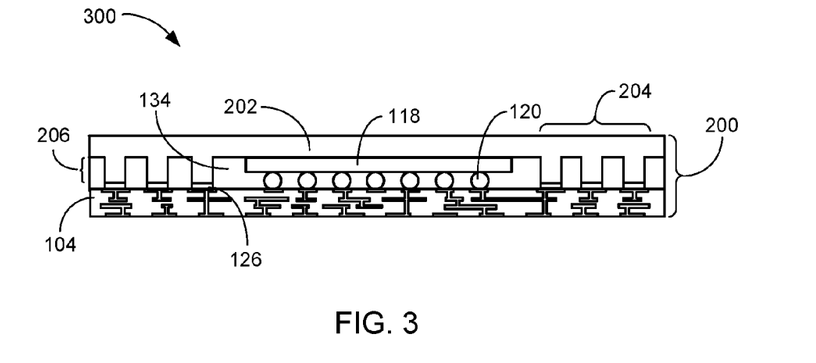
FIG. 3 is a cross-sectional view of an integrated circuit assembly, in a package molding phase of manufacturing.

Referring now to FIG. 3, therein is shown a cross-sectional view of an integrated circuit assembly 300, in a package molding phase of manufacturing. The cross-sectional view of the integrated circuit assembly 300 depicts the integrated circuit assembly 200 having the base package body 134 formed therein.

The base package body 134 may be formed by injecting a molding compound to completely fill the space between the lead frame 202 and the base package substrate 104. The base package body 134 may completely encase the first integrated circuit die 118, the chip interconnects 120, the conductive adhesive 126, and all of the coupling leads 206 in the array 204.

Figure 4:
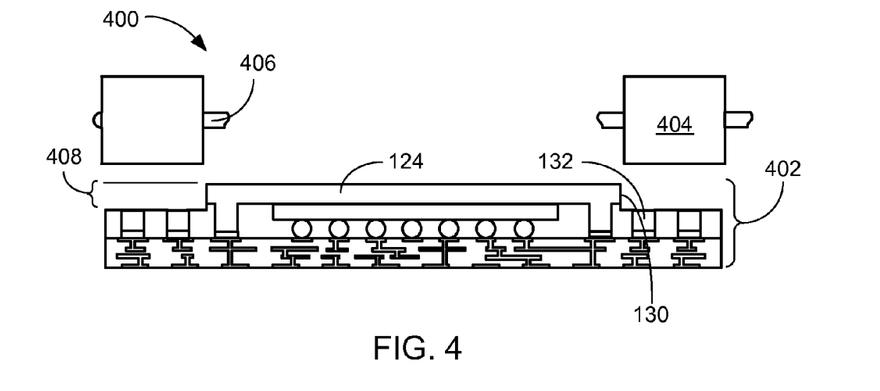
FIG. 4 is a cross-sectional view of an integrated circuit assembly, in a package singulation and shaping phase of manufacturing.

Referring now to FIG. 4, therein is shown a cross-sectional view of an integrated circuit assembly 400, in a package shaping phase of manufacturing. The cross-sectional view of the integrated circuit assembly 400 depicts a base package assembly 402 having been shaped by rotating saws 404 connected by saw shaft 406.

The rotating saws 404 may saw through the lead frame 202, of FIG. 2, in order to separate the conductive shield 124 and the pillar interconnects 132. A package step 408 may expose the finished surface 130, which may include the conductive shield 124, the pillar interconnects 132, and the base package body 134. The separation of the conductive shield 124 and the pillar interconnects 132 forms a planar peripheral region of the base package body 134 surrounding the conductive shield 124. The pillar interconnects 132 are exposed from and coplanar with the planar peripheral region of the base package body 134. All of these elements will show evidence of being sawed or ground to their finished level.

It has been discovered that the package shaping process may be combined with the singulation process in order to maintain the precise position and depth control. The rotating saws 404 that could include the singulation saw is not shown for simplicity.

Figure 5:
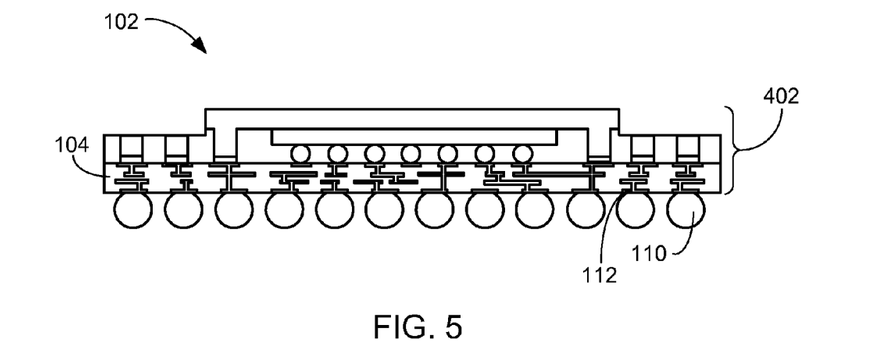
FIG. 5 is a cross-sectional view of the base package of the integrated circuit package system of FIG. 1.

Referring now to FIG. 5, therein is shown a cross-sectional view of the base package 102 of the integrated circuit package system 100, of FIG. 1. The cross-sectional view of the base package 102 depicts the base package assembly 402 having the system interconnects 110 formed on the system contacts 112 of the base package substrate 104.

Figure 6:
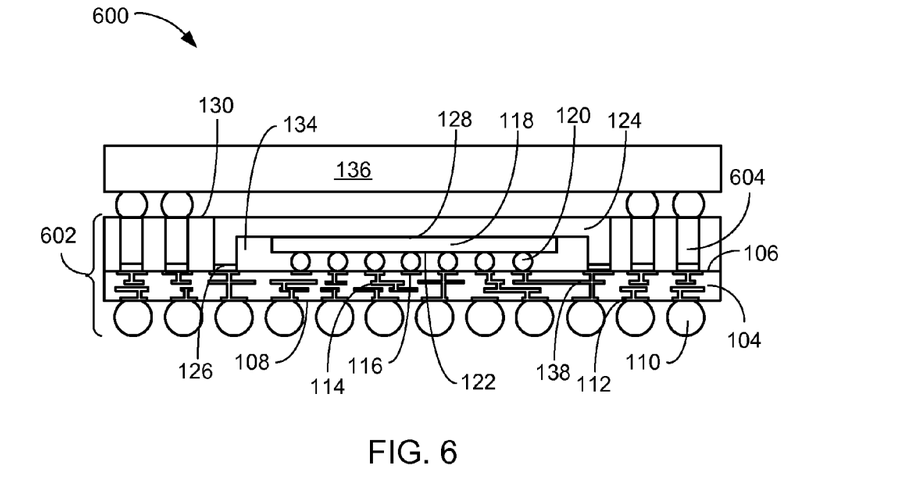
FIG. 6 is a cross-sectional view of an integrated circuit package system with package stacking in a second embodiment of the present invention.

Referring now to FIG. 6, therein is shown a cross-sectional view of an integrated circuit package system 600 with package stacking in a second embodiment of the present invention. The cross-sectional view of the integrated circuit package system 600 depicts a base package 602 having the base package substrate 104, such as a laminate substrate, with the component side 106 and the system side 108.

The system interconnects 110, such as solder balls, solder bumps, solder columns or stud bumps, may be coupled to the system contacts 112 on the system side 108. The internal circuitry 114, such as buried traces, vias, or a combination thereof, may couple the system contacts 112 to the component contacts 116 on the component side 106.

The first integrated circuit die 118 may be coupled to the component contacts 116 by the chip interconnects 120, such as solder bumps or solder balls. The chip interconnects 120 may be positioned between the active side 122 and the component contacts 116. The conductive shield 124 may be electrically connected to the component contacts 116 by the conductive adhesive 126, such as solder or conductive epoxy, and may be directly on the inactive side 128 of the first integrated circuit die 118. The conductive shield 124 may be formed of a metal, such as copper (CU), nickel (NI), tin (SN), or an alloy thereof.

The conductive shield 124, having the finished surface 130 showing evidence of sawing, grinding or etching, may be directly coupled to the first integrated circuit die 118 and the system interconnects 110 by the internal circuitry 114 for applying the reference voltage (not shown) to the conductive shield 124 and the first integrated circuit die 118. It has been discovered that this direct coupling may provide an electromagnetic interference (EMI) shield while also providing a thermal path to reduce the operating temperature of the first integrated circuit die 118.

Pillar interconnects 604 may be grouped around the conductive shield 124 with a closer spacing than is possible for the system interconnects 110. The pillar interconnects 604 may be electrically connected to the component contacts 116 by the conductive adhesive 126. The pillar interconnects 604 may have a height that is equal to the conductive shield 124. The top surface of the pillar interconnects 604 may be coplanar with the conductive shield 124 and the base package body 134 and collectively form the finished surface 130.

The base package body 134 may be formed of a molding compound injected around the pillar interconnects 132 and between the conductive shield 124 and the component side 106 to completely cover the component side 106, fill the conductive shield 124, and encapsulate the first integrated circuit die 118. The stacked integrated circuit package 136, having the chip interconnects 120, may be positioned above the conductive shield 124 and coupled to the pillar interconnects 132 exposed from the base package body 134. The surface of the pillar interconnects 132 that are used for coupling the stacked integrated circuit package 136 may also show signs of having been sawed, ground, or etched.

The number and position of the chip interconnects 120 that couple the stacked integrated circuit package 136 to the pillar interconnects 604 exposed from the base package body 134 is an example only and the actual number and position may differ. The reference voltage circuit 138 may form the direct connection of between the first integrated circuit die 118, the conductive shield 124, and the system interconnects 110 that may be coupled to the reference voltage of the next level system (not shown).

While the conductive shield 124 may have additional connections to the system interconnects 110 for applying the reference voltage, only one of the reference voltage circuits 138 may couple to the first integrated circuit die 118. It has been discovered that by providing only one of the reference voltage circuits 138 to the first integrated circuit die 118 less reference voltage noise may be coupled into the circuitry.

Figure 7:
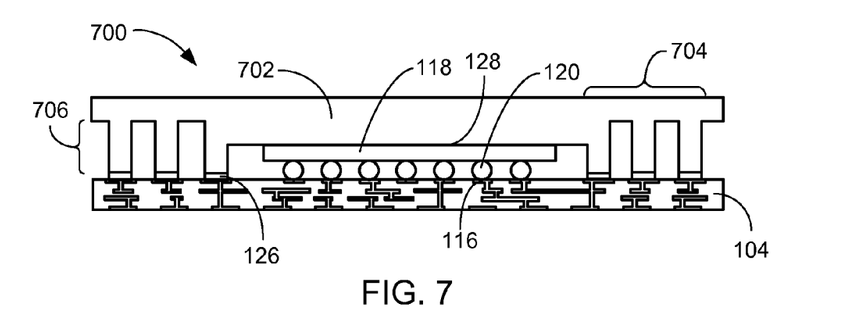
FIG. 7 is a cross-sectional view of an integrated circuit assembly, in a lead frame attach phase of manufacturing.

Referring now to FIG. 7, therein is shown a cross-sectional view of an integrated circuit assembly 700, in a lead frame attach phase of manufacturing. The cross-sectional view of the integrated circuit assembly 700 depicts the base package substrate 104 having the first integrated circuit die 118 electrically connected to the component contacts 116 by the chip interconnects 120.

A lead frame 702 may be positioned directly on the inactive side 128 of the first integrated circuit die 118. The lead frame 702 may include an array 704 of coupling leads 706 arranged around the first integrated circuit die 118. The portion of the lead frame 702 over the first integrated circuit die 118 may be thicker than portion over the array 704.

It has been discovered that the position and number of the coupling leads 706 may be substantially similar to the spacing of the chip interconnects 120 that couple the first integrated circuit die 118 to the base package substrate 104. The lead frame 702 may be formed of a metal, such as copper (CU), nickel (NI), tin (SN), or an alloy thereof. The lead frame 702 may be manufactured by plating, sawing, etching, or molding, in order to provide a high degree of precision as to the placement and spacing of the coupling leads 706 in the array 704.

The coupling leads 706 are of insufficient height to reach the base package substrate 104 when the lead frame 702 is positioned directly on the inactive side 128 of the first integrated circuit die 118. The conductive adhesive 126 may form the electrical and physical connection between the coupling leads 706 and the component contacts 116.

Figure 8:
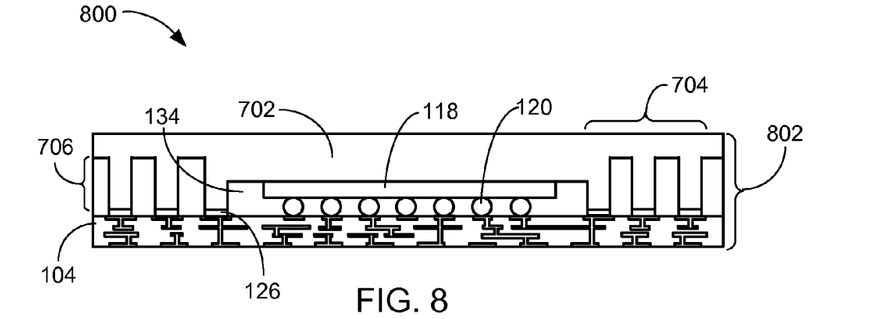
FIG. 8 is a cross-sectional view of an integrated circuit assembly, in a package molding phase of manufacturing.

Referring now to FIG. 8, therein is shown a cross-sectional view of an integrated circuit assembly 800, in a package molding phase of manufacturing. The cross-sectional view of the integrated circuit assembly 800 depicts a base package assembly 802 having the base package body 134 formed therein.

The base package body 134 may be formed by injecting a molding compound to completely fill the space between the lead frame 702 and the base package substrate 104. The base package body 134 may completely encase the first integrated circuit die 118, the chip interconnects 120, the conductive adhesive 126, and all of the coupling leads 706 in the array 704.

Figure 9:
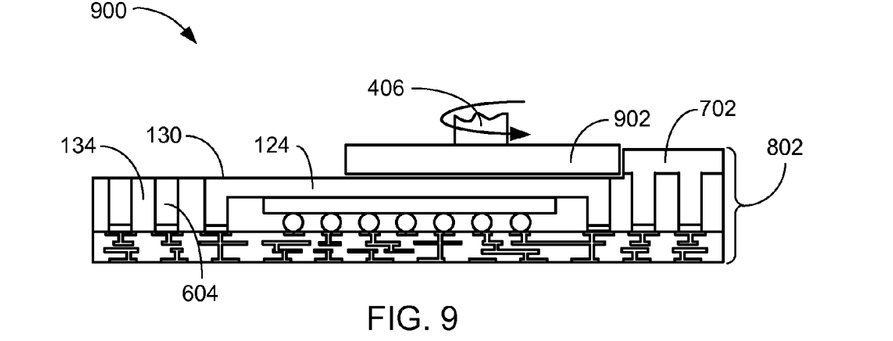
FIG. 9 is a cross-sectional view of an integrated circuit assembly, in a partial lead frame grinding phase of manufacturing.

Referring now to FIG. 9, therein is shown a cross-sectional view of an integrated circuit assembly 900, in a partial lead frame grinding phase of manufacturing. The cross-sectional view of the integrated circuit assembly 900 depicts the base package assembly 802 in the process of being shaped by a grinding wheel 902 connected by the saw shaft 406.

The grinding wheel 902 may grind horizontally through the lead frame 702, of FIG. 7, in order to separate the conductive shield 124 and the pillar interconnects 604. The grinding process may expose the finished surface 130, which may include the conductive shield 124, the pillar interconnects 604, and the base package body 134. All of these elements will show evidence of being sawed or ground to their finished coplanar level.

Figure 10:
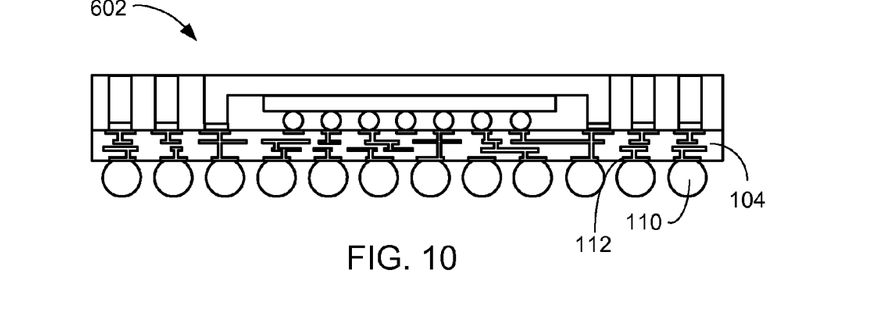
FIG. 10 is a cross-sectional view of the base package of the integrated circuit package system of FIG. 6.

Referring now to FIG. 10, therein is shown a cross-sectional view of the base package 602 of the integrated circuit package system 600, of FIG. 6. The cross-sectional view of the base package 602 depicts the base package assembly 802, of FIG. 8, after the completion of the shaping process and having the system interconnects 110 formed on the system contacts 112 of the base package substrate 104.

Figure 11:
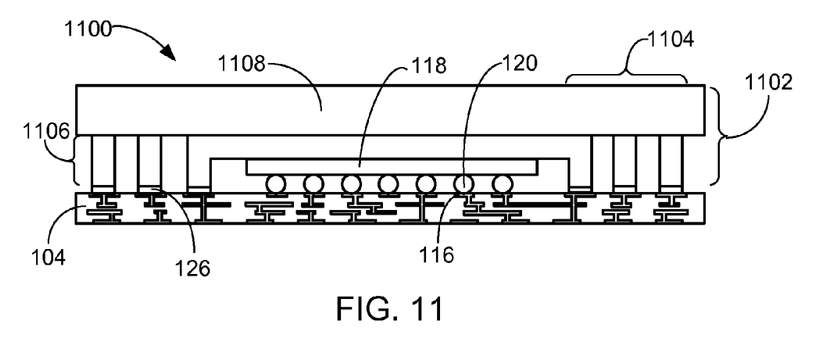
FIG. 11 is a cross-sectional view of an integrated circuit assembly, in a lead frame attach phase of manufacturing.

Referring now to FIG. 11, therein is shown a cross-sectional view of an integrated circuit assembly 1100, in a lead frame attach phase of manufacturing. The cross-sectional view of the integrated circuit assembly 1100 depicts the base package substrate 104 having the first integrated circuit die 118 electrically connected to the component contacts 116 by the chip interconnects 120.

A lead frame 1102 may be positioned directly on the inactive side 128 of the first integrated circuit die 118. The lead frame 1102 may include an array 1104 of the coupling leads 706 arranged around the first integrated circuit die 118. The portion of the lead frame 1102 over the first integrated circuit die 118 may include the conductive shield 124.

It has been discovered that the position and number of coupling leads 1106 may be substantially similar to the spacing of the chip interconnects 120 that couple the first integrated circuit die 118 to the base package substrate 104. The lead frame 1102 may be formed of a metal, such as copper (CU), nickel (NI), tin (SN), or an alloy thereof that is deposited on a dissimilar material such as a lead frame base 1108. The lead frame 1102 may be manufactured by masking and plating, etching, or molding, in order to provide a high degree of precision as to the placement and spacing of the coupling leads 1106 in the array 1104.

The coupling leads 1106 are of insufficient height to reach the base package substrate 104 when the lead frame 1102 is positioned directly on the inactive side 128 of the first integrated circuit die 118. The conductive adhesive 126 may form the electrical and physical connection between the coupling leads 1106 and the component contacts 116.

Figure 12:
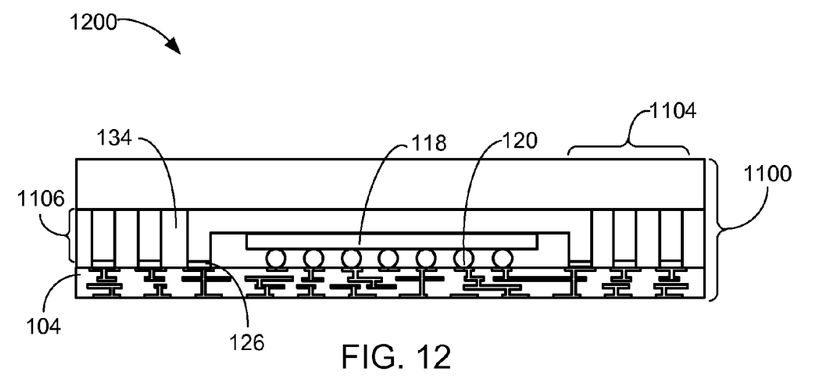
FIG. 12 is a cross-sectional view of an integrated circuit assembly, in a package molding phase of manufacturing.

Referring now to FIG. 12, therein is shown a cross-sectional view of an integrated circuit assembly 1200, in a package molding phase of manufacturing. The cross-sectional view of the integrated circuit assembly 1200 depicts the integrated circuit assembly 1100 having the base package body 134 formed therein.

The base package body 134 may be formed by injecting a molding compound to completely fill the space between the lead frame 1102 and the base package substrate 104. The base package body 134 may completely encase the first integrated circuit die 118, the chip interconnects 120, the conductive adhesive 126, and all of the coupling leads 1106 in the array 1104. The lead frame base 1108 may also be completely covered by the base package body 134.

Figure 13:
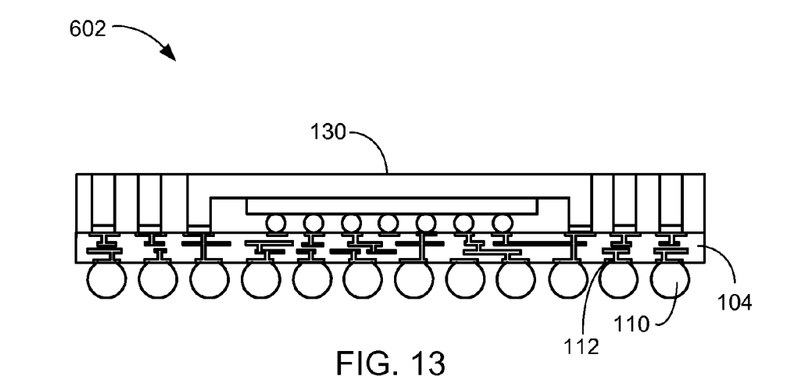
FIG. 13 is a cross-sectional view of the base package in an alternative construction of the integrated circuit package system of FIG. 6.

Referring now to FIG. 13, therein is shown a cross-sectional view of the base package 602 in an alternative construction of the integrated circuit package system 600, of FIG. 6. The cross-sectional view of the base package 602 depicts the integrated circuit assembly 1100, of FIG. 11, after the removal of the lead frame base 1108 by etching and having the system interconnects 110 formed on the system contacts 112 of the base package substrate 104.

The removal of the lead frame base 1108, of FIG. 11, reveals the finished surface 130, which includes the conductive shield 124 and the pillar interconnects 604 exposed from the base package body 134. Each of these elements was coplanar with the lead frame base 1108 prior to its removal by etching.

Figure 14:
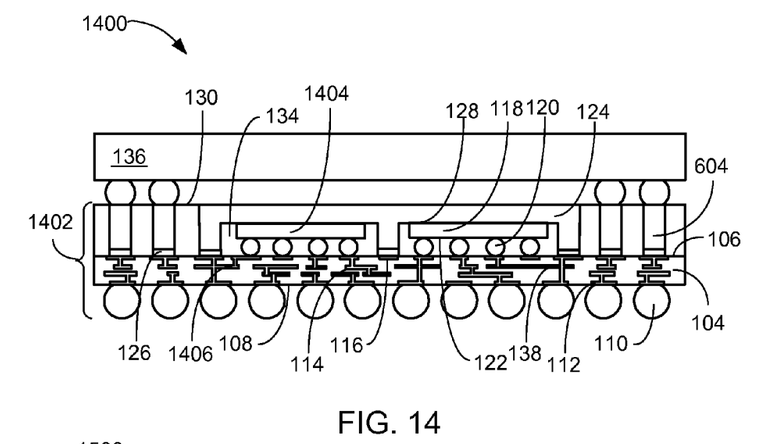
FIG. 14 is a cross-sectional view of an integrated circuit package system with package stacking in a third embodiment of the present invention.

Referring now to FIG. 14, therein is shown a cross-sectional view of an integrated circuit package system 1400 with package stacking in a third embodiment of the present invention. The cross-sectional view of the integrated circuit package system 1400 depicts a base package 1402 having the base package substrate 104, such as a laminate substrate, with the component side 106 and the system side 108.

The system interconnects 110, such as solder balls, solder bumps, solder columns or stud bumps, may be coupled to the system contacts 112 on the system side 108. The internal circuitry 114, such as buried traces, vias, or a combination thereof, may couple the system contacts 112 to the component contacts 116 on the component side 106.

The first integrated circuit die 118 may be coupled to the component contacts 116 by the chip interconnects 120, such as solder bumps or solder balls. The chip interconnects 120 may be positioned between the active side 122 and the component contacts 116.

A second integrated circuit die 1404 may be coupled to the component contacts 116 by the chip interconnects 120, such as solder bumps or solder balls. The chip interconnects 120 may be positioned between the active side 122 or the second integrated circuit die 1404 and the component contacts 116.

The conductive shield 124 may be electrically connected to the component contacts 116 by the conductive adhesive 126, such as solder or conductive epoxy, and may be directly on the inactive side 128 of the first integrated circuit die 118 and the second integrated circuit die 1404. A member of the conductive shield 124 may extend between the first integrated circuit die 118 and the second integrated circuit die 1404. The conductive shield 124 may be formed of a metal, such as copper (CU), nickel (NI), tin (SN), or an alloy thereof.

The conductive shield 124, having the finished surface 130 showing evidence of sawing, grinding or etching, may be directly coupled to the first integrated circuit die 118 and the system interconnects 110 by the internal circuitry 114 for applying the reference voltage (not shown) to the conductive shield 124 and the first integrated circuit die 118. It has been discovered that this direct coupling may provide an electromagnetic interference (EMI) shield while also providing a thermal path to reduce the operating temperature of the first integrated circuit die 118.

The pillar interconnects 604 may be grouped around the conductive shield 124 with a closer spacing than is possible for the system interconnects 110. The pillar interconnects 604 may be electrically connected to the component contacts 116 by the conductive adhesive 126. The pillar interconnects 604 may have a height that is equal to the conductive shield 124. The top surface of the pillar interconnects 604 may be coplanar with the conductive shield 124 and the base package body 134 and collectively form the finished surface 130.

The base package body 134 may be formed of a molding compound injected around the pillar interconnects 604 and between the conductive shield 124 and the component side 106 to completely cover the component side 106. The stacked integrated circuit package 136, having the chip interconnects 120, may be positioned above the conductive shield 124 and coupled to the pillar interconnects 604 exposed from the base package body 134. The surface of the pillar interconnects 604 that are used for coupling the stacked integrated circuit package 136 may also show signs of having been sawed, ground, or etched.

The number and position of the chip interconnects 120 that couple the stacked integrated circuit package 136 to the pillar interconnects 604 exposed from the base package body 134 is an example only and the actual number and position may differ. The reference voltage circuit 138 may form the direct connection of between the first integrated circuit die 118, the conductive shield 124, and the system interconnects 110 that may be coupled to the reference voltage of the next level system (not shown).

A second reference voltage circuit 1406 may be formed in the base package substrate 104 for coupling the second integrated circuit die 1404 to the conductive shield 124 and the system interconnects 110 that may be coupled to the reference voltage of the next level system (not shown). By maintaining separate copies of the reference voltage circuit 138 and the second reference voltage circuit 1406, reference voltage noise will not be coupled between the first integrated circuit die 118 and the second integrated circuit die 1404.

While the conductive shield 124 may have additional connections to the system interconnects 110 for applying the reference voltage, only one of the reference voltage circuits 138 may couple to the first integrated circuit die 118. It has been discovered that, by providing only one of the reference voltage circuits 138 to the first integrated circuit die 118, less reference voltage noise may be coupled into the circuitry.

Figure 15:
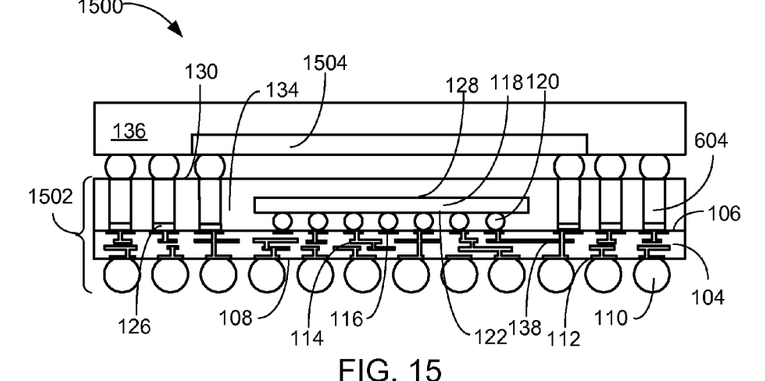
FIG. 15 is a cross-sectional view of an integrated circuit package system with package stacking in a fourth embodiment of the present invention.

Referring now to FIG. 15, therein is shown a cross-sectional view of an integrated circuit package system 1500 with package stacking in a fourth embodiment of the present invention. The cross-sectional view of the integrated circuit package system 1500 depicts a base package 1502 having the base package substrate 104, such as a laminate substrate, with the component side 106 and the system side 108.

The system interconnects may be coupled to the system contacts 112 on the system side 108. The internal circuitry 114, such as buried traces, vias, or a combination thereof, may couple the system contacts 112 to the component contacts 116 on the component side 106.

The first integrated circuit die 118 may be coupled to the component contacts 116 by the chip interconnects 120, such as solder bumps or solder balls. The chip interconnects 120 may be positioned between the active side 122 and the component contacts 116.

The pillar interconnects 604 may be grouped around the first integrated circuit die 118 with a closer spacing than is possible for the system interconnects 110. The pillar interconnects 604 may be electrically connected to the component contacts 116 by the conductive adhesive 126. The top surface of the pillar interconnects 604 may be coplanar with the base package body 134 and collectively form the finished surface 130.

The base package body 134 may be formed of a molding compound injected around the pillar interconnects 604 and between the conductive shield 124 and the component side 106 to completely cover the component side 106. The stacked integrated circuit package 136, having the chip interconnects 120, may be positioned above the first integrated circuit die 118 and coupled to the pillar interconnects 604 exposed from the base package body 134. The surface of the pillar interconnects 604 that are used for coupling the stacked integrated circuit package 136 may also show signs of having been sawed, ground, or etched.

The stacked integrated circuit package 136 may include a ground plane 1504 that may be coupled to the pillar interconnects 604 that are closest to the first integrated circuit die 118. The number and position of the chip interconnects 120 that couple the stacked integrated circuit package 136 to the pillar interconnects 604 exposed from the base package body 134 is an example only and the actual number and position may differ. The reference voltage circuit 138 may form the direct connection of between the first integrated circuit die 118, the ground plane 1504 of the stacked integrated circuit package 136, and the system interconnect 110 that may be coupled to the reference voltage of the next level system (not shown).

While the ground plane 1504 of the stacked integrated circuit package 136 may have additional connections to the system interconnects 110 for applying the reference voltage, only one of the reference voltage circuits 138 may couple to the first integrated circuit die 118. It has been discovered that, by providing only one of the reference voltage circuits 138 to the first integrated circuit die 118, less reference voltage noise may be coupled into the circuitry.

Figure 16:
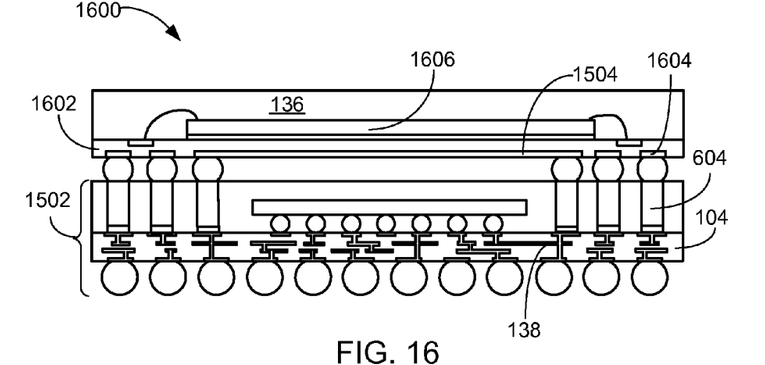
FIG. 16 is a cross-sectional view of an integrated circuit package system with package stacking in a fifth embodiment of the present invention.

Referring now to FIG. 16, therein is shown a cross-sectional view of an integrated circuit package system 1600 with package stacking in a fifth embodiment of the present invention. The cross-sectional view of the integrated circuit package system 1600 depicts the base package 1502 having the stacked integrated circuit package 136 mounted thereon.

The stacked integrated circuit package 136 may include a stacked package substrate 1602 with the ground plane 1504 and interface contacts 1604. A second integrated circuit die 1606, such as a wire bond type of die may be coupled to the base package substrate 104 through the pillar interconnects 604.

By coupling the ground plane 1504 through the pillar interconnects 604 to the reference voltage circuit 138 an EMI shield may be formed between the first integrated circuit die 118 and the second integrated circuit die 1606.

Figure 17:
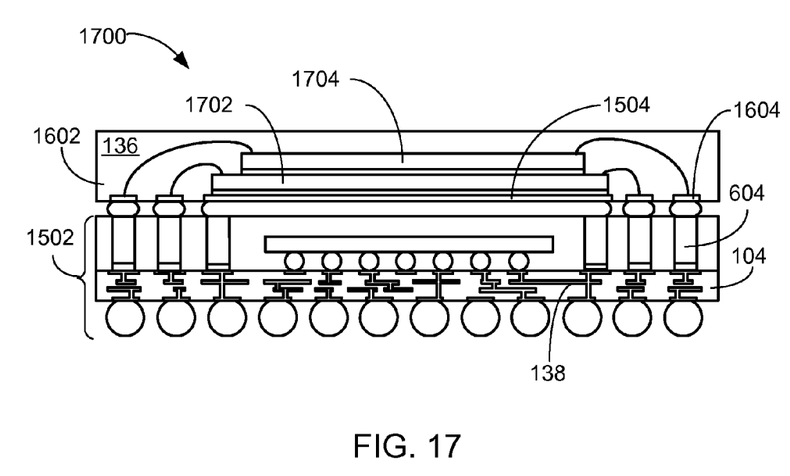
FIG. 17 is a cross-sectional view of an integrated circuit package system with package stacking in a sixth embodiment of the present invention.

Referring now to FIG. 17, therein is shown a cross-sectional view of an integrated circuit package system 1700 with package stacking in a sixth embodiment of the present invention. The cross-sectional view of the integrated circuit package system 1700 depicts the base package 1502 having the stacked integrated circuit package 136 mounted thereon.

The stacked integrated circuit package 136 may include the stacked package substrate 1602 with the ground plane 1504 and the interface contacts 1604. A second integrated circuit die 1702 and a third integrated circuit die 1704, such as wire bond type of dice may be coupled to the base package substrate 104 through the pillar interconnects 604.

By coupling the ground plane 1504 through the pillar interconnects 604 to the reference voltage circuit 138 an EMI shield may be formed between the first integrated circuit die 118, the second integrated circuit die 1702, and the third integrated circuit die 1704.

Figure 18:
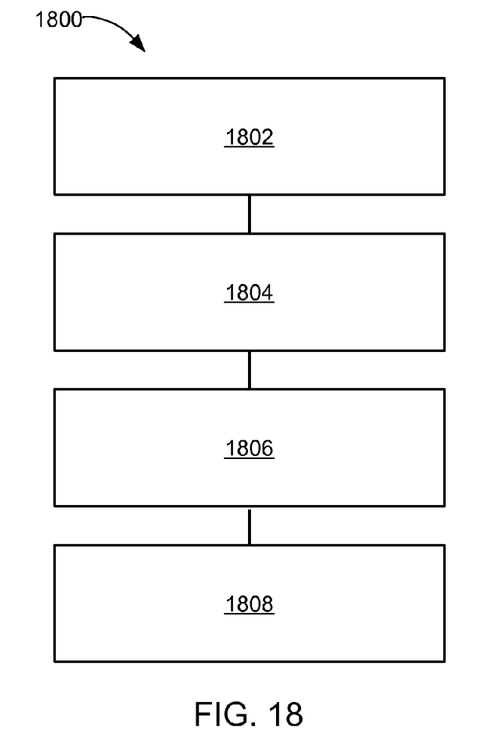
FIG. 18 is a flow chart of a method of manufacture of an integrated circuit package system in an embodiment of the present invention.

Referring now to FIG. 18, therein is shown a flow chart of a method 1800 of manufacture of the integrated circuit package system 100 in an embodiment of the present invention. The method 1800 includes: providing a base package substrate including: forming component contacts on a component side of the base package substrate, forming system contacts on a system side of the base package substrate, and forming a reference voltage circuit between the component contacts and the system contacts in a block 1802; mounting a first integrated circuit die on the component contacts in a block 1804; mounting a lead frame on the first integrated circuit die and coupled to the component contacts in a block 1806; and isolating a conductive shield from the lead frame, the conductive shield coupled to the reference voltage circuit in a block 1808.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit package systems fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    providing a base package substrate including:
        forming component contacts on a component side of the base package substrate,
        forming system contacts on a system side of the base package substrate, and
        forming a reference voltage circuit between the component contacts and the system contacts;
    mounting a first integrated circuit die on the component contacts;
    mounting a lead frame on the first integrated circuit die and coupled to the component contacts;
    isolating a conductive shield, with integrated vertical coupling leads, from the lead frame, the conductive shield mounted in direct contact with the first integrated circuit die and the integrated vertical coupling leads coupled to the reference voltage circuit;
    forming a base package body, with vertical sides coplanar with vertical edges of the base package substrate, including embedding the integrated vertical coupling leads by completely filling the conductive shield that is exposed from and surrounded by a planar peripheral region of the base package body; and
    exposing an array of pillar interconnects coplanar with the planar peripheral region of the base package body, each including a surface exposed from the planar peripheral region and the surfaces showing signs of having been sawed, ground, or etched.

2. The method as claimed in claim 1 further comprising providing an array of coupling leads on the lead frame.

3. The method as claimed in claim 1 wherein forming the base package body includes forming the base package body on the pillar interconnects and between the lead frame and the base package substrate.

4. The method as claimed in claim 1 further comprising forming pillar interconnects from the lead frame.

5. The method as claimed in claim 1 further comprising mounting a stacked integrated circuit package over the first integrated circuit die including providing the conductive shield between the stacked integrated circuit package and the first integrated circuit die.

6. A method of manufacture of an integrated circuit package system comprising:
    providing a base package substrate including:
        forming component contacts on a component side of the base package substrate,
        forming system contacts on a system side of the base package substrate, and forming a reference voltage circuit between the component contacts and the system contacts by coupling two adjacent units of the component contacts to the closest unit of the system contacts;

mounting a first integrated circuit die on the component contacts including coupling a chip interconnect to one of the component contacts of the reference voltage circuit;

mounting a lead frame on the first integrated circuit die and coupled to the component contacts including applying a conductive adhesive between the lead frame and one of the component contacts of the reference voltage circuit;

isolating a conductive shield, with integrated vertical coupling leads, from the lead frame by sawing, grinding or etching including having the conductive shield mounted in direct contact with the first integrated circuit die and the integrated vertical coupling leads coupled to the reference voltage circuit;

forming a base package body, with vertical sides coplanar with vertical edges of the base package substrate, including embedding the integrated vertical coupling leads by completely filling the conductive shield that is exposed from and surrounded by a planar peripheral region of the base package body; and exposing an array of pillar interconnects coplanar with the planar peripheral region of the base package body, each including a surface exposed from the planar peripheral region and the surfaces showing signs of having been sawed, ground, or etched.

7. The method as claimed in claim 6 wherein isolating the conductive shield from the lead frame by sawing, grinding or etching includes applying a rotating saw, a grinding wheel, or a chemical etch to the lead frame.

8. The method as claimed in claim 6 wherein forming the base package body includes forming the base package body on the pillar interconnects and between the lead frame and the base package substrate by injecting a molding compound.

9. The method as claimed in claim 6 further comprising forming a finished surface including sawing, grinding, or etching a base package body to be coplanar with the pillar interconnects.

10. The method as claimed in claim 6 further comprising mounting a stacked integrated circuit package over the first integrated circuit die including providing the conductive shield between the stacked integrated circuit package and the first integrated circuit die includes coupling a system interconnect to the reference voltage circuit.

11. An integrated circuit package system comprising:
a base package substrate including:
component contacts on a component side of the base package substrate,
system contacts on a system side of the base package substrate, and
a reference voltage circuit connected between the component contacts and the system contacts;

a first integrated circuit die mounted on the component contacts;

a conductive shield, with integrated vertical coupling leads, mounted in direct contact with the first integrated circuit die and the integrated vertical coupling leads coupled to the reference voltage circuit through the component contacts;

a base package body, with vertical sides coplanar with vertical edges of the base package substrate, formed to embed the integrated vertical coupling leads and completely fill the conductive shield that is exposed from and surrounded by a planar peripheral region of the base package body; and an array of pillar interconnects coplanar with and exposed from the planar peripheral region of the base package body, each including a surface exposed from the planar peripheral region and the surfaces showing signs of having been sawed, ground, or etched.

12. The system as claimed in claim 11 wherein the array of pillar interconnects surrounds the conductive shield.

13. The system as claimed in claim 11 wherein the base package body is formed on the pillar interconnects and between the conductive shield and the base package substrate.

14. The system as claimed in claim 11 further comprising internal circuitry between the component contacts and the system contacts in the base package substrate.

15. The system as claimed in claim 11 further comprising a stacked integrated circuit package over the first integrated circuit die.

16. The system as claimed in claim 11 further comprising:
a chip interconnect between the first integrated circuit die and the reference voltage circuit; and
a conductive adhesive between the conductive shield and the reference voltage circuit.

17. The system as claimed in claim 16 wherein the array of pillar interconnects surrounds the conductive shield wherein the conductive adhesive is between the pillar interconnects and the component contacts.

18. The system as claimed in claim 16 wherein the base package body is formed on the pillar interconnects and between the conductive shield and the base package substrate in which the first integrated circuit die, the chip interconnects, and the component side are encapsulated.

19. The system as claimed in claim 16 further comprising internal circuitry between the component contacts and the system contacts in the base package substrate, the internal circuitry includes internal traces, vias, or a combination thereof.

20. The system as claimed in claim 16 further comprising a stacked integrated circuit package over the first integrated circuit die includes a second integrated circuit die over the conductive shield.

* * * * *